United States Patent
Lee et al.

(10) Patent No.: US 11,147,160 B2
(45) Date of Patent: Oct. 12, 2021

(54) CIRCUIT BOARD AND METHOD FOR MANUFACTURING SAME

(71) Applicant: STEMCO CO., LTD., Cheongju-si (KR)

(72) Inventors: Sang Chul Lee, Cheongju-si (KR); Hyo Jin Park, Sejong (KR)

(73) Assignee: STEMCO CO., LTD., Cheongju-si (KR)

( * ) Notice: Subject to any disclaimer, the term of this patent is extended or adjusted under 35 U.S.C. 154(b) by 0 days.

(21) Appl. No.: 16/818,274

(22) Filed: Mar. 13, 2020

(65) Prior Publication Data

US 2020/0221571 A1   Jul. 9, 2020

Related U.S. Application Data

(63) Continuation of application No. PCT/KR2018/010024, filed on Aug. 30, 2018.

(30) Foreign Application Priority Data

Sep. 15, 2017   (KR) .................. 10-2017-0118750

(51) Int. Cl.
  *H05K 1/02*   (2006.01)
  *H05K 1/11*   (2006.01)
  *H05K 1/18*   (2006.01)
(52) U.S. Cl.
  CPC ......... *H05K 1/0298* (2013.01); *H05K 1/0271* (2013.01); *H05K 1/116* (2013.01);
  (Continued)

(58) Field of Classification Search
  CPC ...... H05K 1/0298; H05K 1/116; H05K 1/184; H05K 2201/09409; H05K 2201/10863;
  (Continued)

(56) References Cited

U.S. PATENT DOCUMENTS

| 9,565,763 B2 * | 2/2017 | Nam ..................... H05K 3/4623 |
| 2004/0178486 A1 * | 9/2004 | Maeda ................. H05K 1/0271 |
| | | 257/678 |

(Continued)

FOREIGN PATENT DOCUMENTS

| JP | 2000-332396 A | 11/2000 |
| JP | 2007-184381 A | 7/2007 |

(Continued)

OTHER PUBLICATIONS

International Search Report issued in PCT/KR2018/010024; dated Dec. 14, 2018.

(Continued)

*Primary Examiner* — Steven T Sawyer
(74) *Attorney, Agent, or Firm* — Studebaker & Brackett PC (57) ABSTRACT

Disclosed herein are a circuit board and a method of fabricating the same. The circuit board includes: a base substrate having a device mount area defined thereon; a first wiring pattern formed on a first surface of the base substrate; a dummy pattern formed on the base substrate, wherein at least a part of the device mount area is filled with the dummy pattern; a first protective layer covering the first wiring pattern and the dummy pattern; and a lead pattern formed on the first protective layer, wherein the lead pattern is extended to the device mount area.

14 Claims, 7 Drawing Sheets

(52) U.S. Cl.
CPC ... *H05K 1/184* (2013.01); *H05K 2201/09409* (2013.01); *H05K 2201/10863* (2013.01)

(58) Field of Classification Search
CPC ... H05K 1/11; H05K 3/28; H05K 3/42; H05K 1/0271; H05K 1/113; H05K 3/4623; H05K 3/4038; H05K 3/4652; H05K 2201/0358; H05K 2201/2009; H05K 2203/063; H05K 2201/0355; H05K 2203/0562; H05K 2201/09909; H01L 23/49822; H01L 23/562

See application file for complete search history.

(56) References Cited

U.S. PATENT DOCUMENTS

| | | | |
|---|---|---|---|
| 2005/0263884 A1* | 12/2005 | Sawada | H05K 1/0224 257/737 |
| 2006/0207088 A1* | 9/2006 | Yamano | H01L 21/6835 29/831 |
| 2006/0266545 A1 | 11/2006 | Takeuchi et al. | |
| 2007/0002545 A1* | 1/2007 | Cho | H01L 23/49811 361/748 |
| 2007/0215991 A1 | 9/2007 | Chang et al. | |
| 2008/0203563 A1 | 8/2008 | Takahashi | |
| 2008/0315437 A1 | 12/2008 | Lee et al. | |
| 2009/0139751 A1* | 6/2009 | Sunohara | H01L 23/562 174/255 |
| 2009/0195997 A1* | 8/2009 | Ishimaru | H01L 23/562 361/761 |
| 2009/0273076 A1* | 11/2009 | Choi | H01L 23/4985 257/702 |
| 2009/0277667 A1* | 11/2009 | Ebe | H05K 1/0209 174/251 |
| 2010/0061065 A1* | 3/2010 | Hayashiyama | H05K 1/0271 361/752 |
| 2013/0092421 A1* | 4/2013 | Kajiya | H05K 1/0206 174/252 |
| 2013/0271929 A1* | 10/2013 | Malatkar | H01L 23/49838 361/748 |
| 2015/0091176 A1* | 4/2015 | Otremba | H01L 24/20 257/773 |
| 2015/0245484 A1* | 8/2015 | Ryu | H05K 1/0271 174/262 |
| 2016/0057863 A1* | 2/2016 | Kyozuka | H01L 23/5385 361/764 |
| 2016/0088727 A1* | 3/2016 | Furutani | H05K 3/4673 361/783 |
| 2016/0379937 A1* | 12/2016 | Cho | H05K 1/111 174/261 |
| 2017/0338172 A1* | 11/2017 | Yosui | H01L 21/4853 |
| 2018/0213653 A1* | 7/2018 | Tago | H05K 3/0011 |

FOREIGN PATENT DOCUMENTS

| | | |
|---|---|---|
| JP | 2009-135184 A | 6/2009 |
| JP | 2010-232616 A | 10/2010 |
| JP | 2013-021486 A | 1/2013 |
| JP | 2013-128118 A | 6/2013 |
| TW | 448550 B | 8/2001 |
| TW | 540260 B | 7/2003 |
| TW | 557522 B | 10/2003 |
| WO | 2017/065028 A1 | 4/2017 |

OTHER PUBLICATIONS

Office Action issued in KR 10-2017-0106694; mailed by the Korean Intellectual Property Office dated Oct. 23, 2019.

Office Action issued in TW 107130344; mailed by the Taiwan Intellectual Property Office dated Jan. 15, 2020.

An Office Action; "Notice of Reasons for Refusal," mailed by the Japanese Patent Office dated Apr. 6, 2021, which corresponds to Japanese Patent Application No. 2020-515002 and is related to U.S. Appl. No. 16/818,274; with English language translation.

* cited by examiner

- Prior Art -

CIRCUIT BOARD AND METHOD FOR MANUFACTURING SAME

CROSS-REFERENCE TO RELATED APPLICATIONS

This application is a Continuation of International Application No. PCT/KR2018/010024 filed Aug. 30, 2018, which claims benefit of priority to Korean Patent Application No. 10-2017-0118750 filed Sep. 15, 2017, the entire content of which is incorporated herein by reference.

TECHNICAL FIELD

The present disclosure relates to a circuit board and a method of fabricating the same, and more particularly to a circuit board including a dummy pattern and a method of fabricating the same.

BACKGROUND ART

Recently, as the size of electronic devices is ever reduced, a chip on film (COF) package technology using a flexible circuit board is being employed. Flexible circuit boards and the COF package technology using the same are used in flat panel display (FPD) devices, such as liquid-crystal crystal display (LCD) device and organic light-emitting diode (OLED) display devices. A display driving IC (DDIC) for driving a flat panel display device, for example, may be mounted on such a circuit board.

Figure 11:
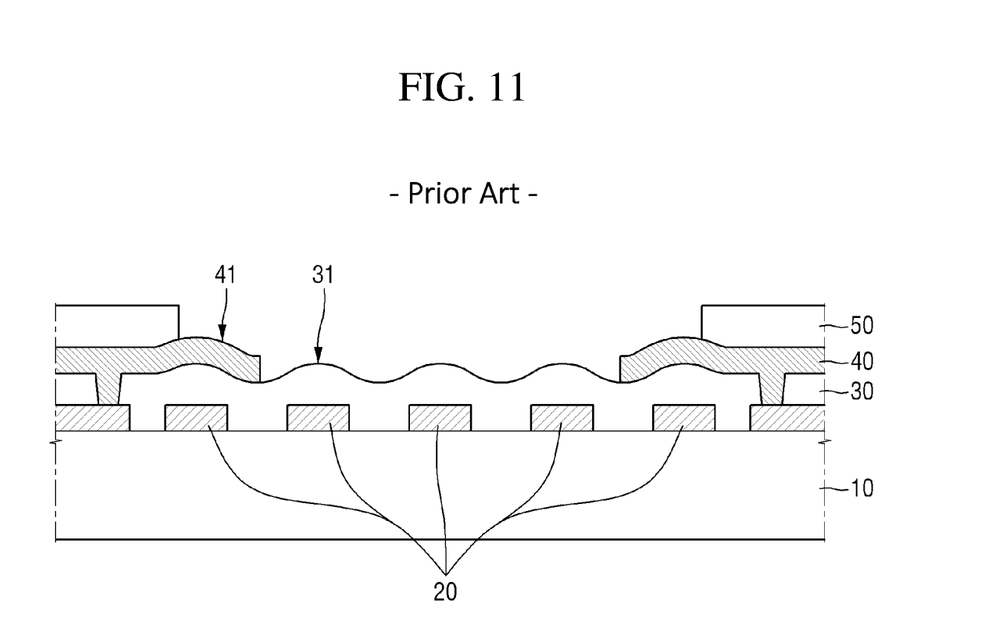
FIG. 11 is a cross-sectional view of an existing circuit board.

FIG. 11 is a cross-sectional view of an existing circuit board.

In FIG. 11, wiring patterns 20 are formed on a base substrate 10, and a first protective layer 30 is formed to cover the wiring patterns 20. Since the wiring patterns 20 protrude from the base substrate 10, the first protective layer 30 covering the wiring patterns 20 may have the uneven surface along the shape of the upper surface of the wiring patterns 20. In addition, during a reflow process for mounting a device, the surface of the first protective layer 30 already formed on the substrate may be deformed or become uneven.

Moreover, a lead pattern 40 is formed to connect a DDIC mounted on the circuit board with the wiring patterns 20. The lead pattern 40 may become curvy or uneven along the shape of the upper surface of the first protective layer 30 described above. As a result, there is a problem that a device or a bump may fail to be reliably bonded to the upper surface 41 of the lead pattern during a reflow process.

DISCLOSURE

Technical Problems

Aspects of the present disclosure provide a circuit board including a dummy pattern and a method of fabricating the same.

This and other aspects, embodiments and advantages of the present disclosure will become immediately apparent to those of ordinary skill in the art upon review of the Detailed Description and Claims to follow.

Technical Solutions

According to an aspect of the present disclosure, there is provided a circuit board including: a base substrate having a device mount area defined thereon; a first wiring pattern formed on a first surface of the base substrate; a dummy pattern formed on the base substrate, wherein at least a part of the device mount area is filled with the dummy pattern; a first protective layer covering the first wiring pattern and the dummy pattern; and a lead pattern formed on the first protective layer, wherein the lead pattern is extended to the device mount area.

The lead pattern may include a bonding portion where a device is mounted in the device mount area, and wherein the dummy pattern is expanded outwardly of the bonding portion by a first distance.

The first distance may range from 0.1 μm to 100 μm.

The dummy pattern may include a hole via which the first surface of the base substrate in the device mount area is exposed; and a periphery around the hole.

The circuit board may further include: a through hole formed through the first protective layer, wherein the first wiring pattern is exposed via the through hole; and a connection wiring electrically connecting the lead pattern with the first wiring pattern, wherein the through hole is filled with the connection wiring.

The circuit board may further include: a second protective layer formed to cover the lead pattern above the first protective layer.

The dummy pattern may not be connected to the first wiring pattern.

The circuit board may further include: a second wiring pattern formed on a second surface of the base substrate; and the second wiring pattern may be electrically connected to the first wiring pattern by a via penetrating through the base substrate.

The circuit board may be implemented as a stack of n layers, where n is a natural number equal to or greater than two.

According to another aspect of the present disclosure, there is provided a method of fabricating a circuit board, the method including: providing a base substrate having a device mount area defined thereon; forming a wiring pattern and a dummy pattern in the device mount area, on a first surface of the base substrate; forming a first protective layer to cover the wiring pattern and the dummy pattern; and forming a lead pattern extended from the device mount area on the first protective layer.

The forming the lead pattern may include forming a through hole through the first protective layer to expose the wiring pattern; forming a connection wiring so that the via hole is filled with it; plating a surface of the connection wiring.

The method may include simultaneously forming the connection wiring and the lead pattern.

The circuit board may further include: a second protective layer formed to cover the lead pattern above the first protective layer.

The method may further include: forming an additional lead pattern on the second protective layer, and an additional protective layer covering the additional lead pattern, to form a circuit board made up of n layers, wherein n is a natural number equal to or greater than two.

The method may further include: bonding another circuit board connected to the wiring pattern or the lead pattern to form a circuit board made up of n layers.

Other particulars of the present disclosure will be described in the detailed description with reference to the accompanying drawings.

Advantageous Effects

According to an exemplary embodiment of the present disclosure, a dummy pattern is formed in a device mount area of a circuit board, and accordingly the surface of an insulating layer or a protective layer covering the mount area can be formed evenly, thereby ensuring the connection between the device and lead patterns. Additionally, the unevenness can be reduced by the dummy pattern and the efficiency of heat dissipation can be improved.

It should be noted that effects of the present disclosure are not limited to the above-described effects, and other effects of the present disclosure will be apparent to those skilled in the art from the following descriptions.

BEST MODES FOR CARRYING OUT THE INVENTION

Advantages and features of the present disclosure and methods to achieve them will become apparent from the descriptions of exemplary embodiments hereinbelow with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims. In the drawings, the sizes of the elements may be exaggerated and not drawn on scale for illustrative purposes. In the drawings, like numerals refer to the same or similar elements or functionality throughout the several views. The term "and/or" used herein includes any and all combinations of one or more of the associated listed items.

It will be understood that when an element or layer is referred to as being "on" another element or layer, the element or layer can be directly on another element or layer or intervening elements or layers may also be present. In contrast, when an element is referred to as being "directly on" another element, there is no intervening element present.

Spatially relative terms, such as "below," "beneath," "lower," "above," "upper" and the like may be used herein for ease of description to describe one element's relationship to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the term "below" can encompass both orientations of above and below. The device may be otherwise oriented and the spatially relative descriptors used herein interpreted accordingly.

Terms used herein are for illustrating the embodiments rather than limiting the present disclosure. As used herein, the singular forms are intended to include plural forms as well, unless the context clearly indicates otherwise. Throughout this specification, the word "comprise" and variations such as "comprises" or "comprising," will be understood to imply the inclusion of stated elements but not the exclusion of any other elements.

Although terms such as first, second, etc. are used to distinguish arbitrarily between the elements such terms describe, and thus these terms are not necessarily intended to indicate temporal or other prioritization of such elements. Theses terms are used to merely distinguish one element from another. Accordingly, as used herein, a first element may be a second element within the technical scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
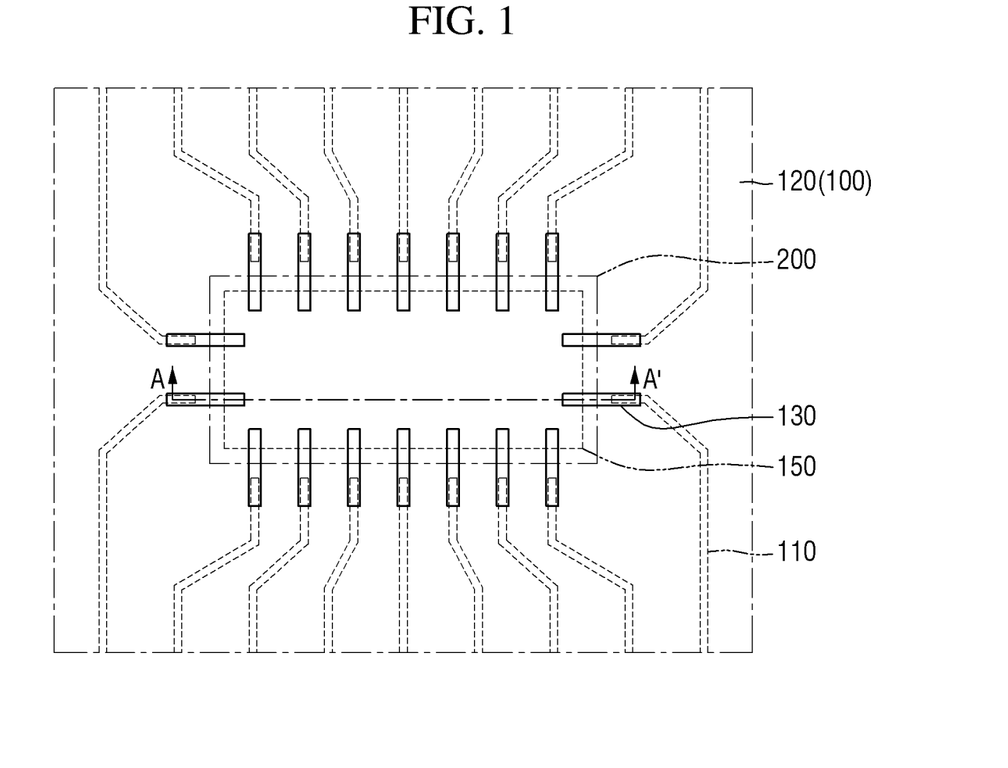
FIG. 1 is a top view of a circuit board according to some exemplary embodiments of the present disclosure.
Figure 2:
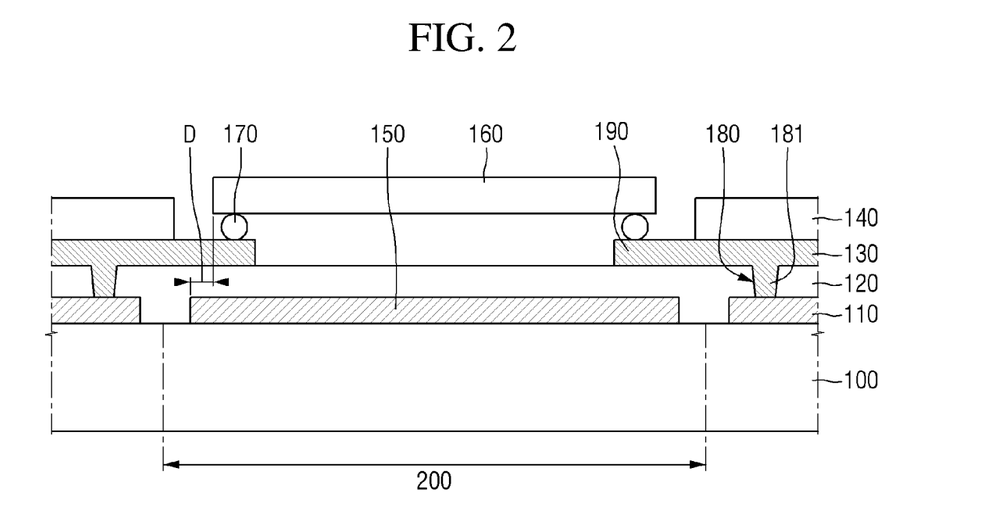
FIG. 2 is a cross-sectional view of a circuit board according to some exemplary embodiments of the present disclosure, taken along line A-A' of FIG. 1.

FIG. 1 is a top view of a circuit board according to some exemplary embodiments of the present disclosure. FIG. 2 is a cross-sectional view of a circuit board according to some exemplary embodiments of the present disclosure, taken along line A-A' of FIG. 1. In FIG. 1, a second protective layer 140 and a device 160 are not depicted for convenience of illustration.

Referring to FIG. 1, a circuit board according to some exemplary embodiments of the present disclosure may include a base substrate 100, a first wiring pattern 110, a first protective layer 120, lead patterns 130, and a second protective layer 140, a dummy pattern 150, etc.

The base substrate 100 may be, for example, a flexible film, and more specifically, may include an insulation film such as a polyimide film, a polyethylene terephthalate (PET) film, a polyethylene naphthalate film and a polycarbonate film, or a metal foil such as aluminum oxide foil.

It is, however, to be understood that the present disclosure is not limited thereto. The base substrate 100 may be a rigid circuit board. More specifically, the base substrate 100 may include an epoxy or phenol resin.

In the following description, a polyimide film will be described as an example of the base substrate 100.

A device mount area 200 where a device is to be mounted may be defined in the base substrate 100. In the device mount area 200 of the circuit board according to some exemplary embodiments of the present disclosure, a device 160 is to be mounted, and the device mount area 200 may include longer sides and shorter sides. More specifically, the device mount area 200 may include the entire surface formed on the inner side of the area where the lead patterns 130 overlap the dummy pattern 150, which will be described later.

Specifically, the device 160 to be mounted in the device mount area 200 may be, for example, a semiconductor device such as a display driving IC (DDI), but the present disclosure is not limited thereto. The device 160 may be a passive element such as a resistor, a capacitor and an inductor.

When the device 160 is a passive element, a connector 170 for connecting the device 160 with the lead patterns 130 may include solder.

When the device 160 is a semiconductor device, a connector 170 for connecting the device 160 with the lead patterns 130 may include a bump. According to some exemplary embodiments of the present disclosure, the device 160 may include a semiconductor device bonded to the lead patterns 130 by flip-chip bonding.

The first wiring pattern 110 may be formed on a surface of the base substrate 100. The first wiring pattern 110 may transmit an electrical signal transmitted to the device 160. The first wiring pattern 110 may include, but is not limited to, a conductive material such as copper. Specifically, the first wiring pattern 110 may include a material having electrical conductivity such as gold and aluminum. In a circuit board according to some exemplary embodiments of the present disclosure, the wiring pattern 110 includes copper.

Although the first wiring pattern 110 is not extended to the device mount area 200 in the example shown in FIG. 1, the present disclosure is not limited thereto. A part of the first wiring pattern 110 may be extended to the device mount area 200.

The first protective layer 120 may be formed to cover the first wiring pattern 110. The first protective layer 120 may be formed to cover the base substrate 100 including the first wiring pattern 110 partially or entirely. The first protective layer 120 may include, for example, a non-conductive material, and specifically, may include a solder resist or a coverlay film.

Figure 3:
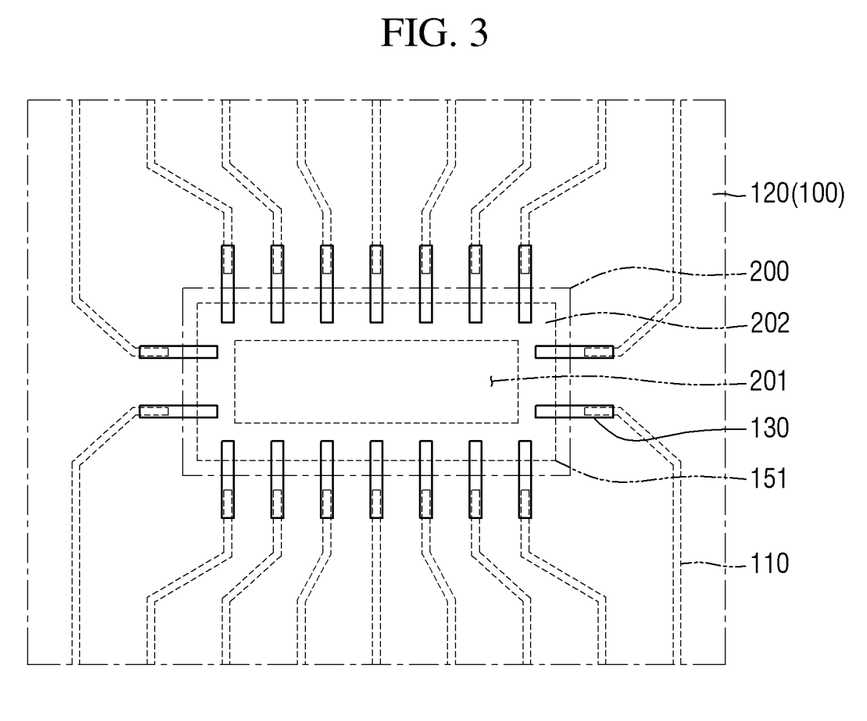
FIG. 3 is a cross-sectional view of a circuit board in accordance with some exemplary embodiments of the present disclosure, taken along the line A-A' of FIG. 1.

In addition, as shown in FIG. 2, a through hole 180 may be formed in the first protective layer 120. The through hole 180 may be filled with a connection line 181. The connection line 181 may electrically connect the lead patterns 130 formed on the first protective layer 120 with the first wiring pattern 110. In the views of FIGS. 2 and 3, the through hole 180 has a trapezoidal cross section, but this is merely illustrative. The through hole 180 may have a rectangular cross section having the width of the upper surface equal to the width of the lower surface. The through hole 180 may have, but is not limited to, a circular cross section when viewed from the top.

The lead patterns 130 may be formed on the first protective layer 120. At least some of the lead patterns 130 may be extended toward the device mount area 200 to include a bonding portion 190 where a device is mounted.

Although seven lead patterns 130 are formed on each of the longer sides and two lead patterns 130 are formed on each of the shorter sides of the device mount area 200 in the example shown in FIG. 1, this is merely illustrative. The number of the plurality of lead patterns 130 may vary depending on the configuration of the elements arranged in the device mount area 200.

The lead patterns 130 may be disposed so that it may at least partially overlap with the first wiring pattern 110 or the dummy pattern 150 formed in the device mount area 200 of the base substrate 100, which will be described later.

The lead patterns 130 may include, but is not limited to, a metal wire with a plated surface, e.g., a copper wire plated with tin, nickel, or aluminum.

The second protective layer 140 may be formed to cover the first protective layer 120 and the lead patterns 130. The second protective layer 140 may cover the lead patterns 130, except a part of the lead patterns 130 bonded to the device 160.

The second protective layer 140 may include, for example, a non-conductive material, and specifically, may include a solder resist or a coverlay film.

According to some exemplary embodiments of the present disclosure, the second protective layer 140 may also be formed on the first protective layer 120 overlapping the device 160. In addition, although not shown in the drawings, the second protective layer 140 may surround the bottom of the device 160 and the connector 170 as an underfill of the device 160.

In such case, the second protective layer 140 on the lead patterns 130 that surrounds the device 160 bonded in the device mount area 200 and the second protective layer 140 under the device 160 may be formed simultaneously. It is, however, to be understood that the present disclosure is not limited thereto. For example, the second protective layer 140 on the lead patterns 130 may be formed first, and the second protective layer 140 under the device 160 may be formed later.

The dummy pattern 150 may be formed entirely in the device mount area 200 on the base substrate 100, and the dummy pattern 150 may not be connected to the adjacent first wiring pattern 110.

The dummy pattern 150 may include the same conductive material as the first wiring pattern 110, but the present disclosure is not limited thereto. For example, the dummy pattern 150 may include, for example, a metal material such as gold, silver and copper or an epoxy resin, a polyimide resin, a carbon resin, etc.

The dummy pattern 150 formed of the above-listed materials may overlap the device 160 mounted in the device mount area 200. Therefore, when the device 160 is driven, a part of the heat generated from the device 160 may be discharged to the outside through the dummy pattern 150.

In addition, the first wiring pattern 110 and the dummy pattern 150 may be formed simultaneously. It is, however, to be understood that the present disclosure is not limited thereto. They may be formed at different processes.

As the dummy pattern 150 is formed on the base substrate 100 in the device mount area 200 where the first wiring pattern 110 is not formed, the profile of the upper surface of the first protective layer 120 in the device mount area 200 can be made flat.

For the existing circuit board described above with reference to FIG. 11, due to the plurality of wiring patterns 20 formed in the device mount area and spaces 21 therebetween, the upper surface of the first protective layer 31 covering them and the lead pattern 41 formed thereon may become uneven. In contrast, for the circuit board according to the exemplary embodiment of the present disclosure, the spaces 21 in the device mount area 200 are filled with the dummy pattern 15, and then the first protective layer 120 covers them, so that the upper surface of the first protective layer 120 can be made flat.

In addition, the upper surface of the dummy pattern 150 may be on the same plane as the first wiring pattern 110. Thus, the distance from the base substrate 100 to the upper surface of the dummy pattern 150 may be equal to the distance from the base substrate 100 to the upper surface of the first wiring pattern 110.

Accordingly, in the circuit board according to some exemplary embodiments of the present disclosure, the unevenness of the upper surface of the first protective layer 120 can be avoided by virtue of the dummy pattern 150 formed in the device mount area 200, so that the device 160 can be mounted more reliably.

In addition, as shown in FIGS. 2 and 3, the dummy pattern 150 may be expanded so that it may be equal to or larger than the area of the device 160 in the device mount area 200. Specifically, the dummy pattern 150 may be extended outwardly from the bonding portion between the connector 170 and the lead pattern 130 by a predetermined distance D. The distance D may be, for example, from 0.1 μm to 100 μm.

The dummy pattern 150 may be formed in the device mount area 200. The device mount area 200 may be filled with the dummy pattern 150. The dummy pattern 150 may not be connected to the first wiring pattern 110.

Hereinafter, shapes of dummy patterns 150 according to some exemplary embodiments of the present disclosure will be described in detail with reference to the drawings. The shape of a dummy pattern 151 may be different from the shape of the dummy pattern 150 according to the above-described exemplary embodiment.

FIG. 3 is a top view of a circuit board according to some exemplary embodiments of the present disclosure. Hereinafter, the redundant description will be omitted and description will be made focusing on the differences.

Referring to FIG. 3, in some exemplary embodiments of the present disclosure, the dummy pattern 151 may include a hole 201 via which a part of the device mount area is exposed, and a periphery 202 around the hole 201.

As such, when the device mount area 200 is not completely filled with the dummy pattern 150, flexibility of the base substrate 100 can be increased. In particular, when the base substrate 100 is a flexible circuit board, the base substrate 100 on which the device 160 is mounted may be bent or folded in an electronic device. At this time, the dummy pattern 151 having the hole 201 formed therein can suppress the deterioration of the flexibility of the device mount area 200.

Figure 4:
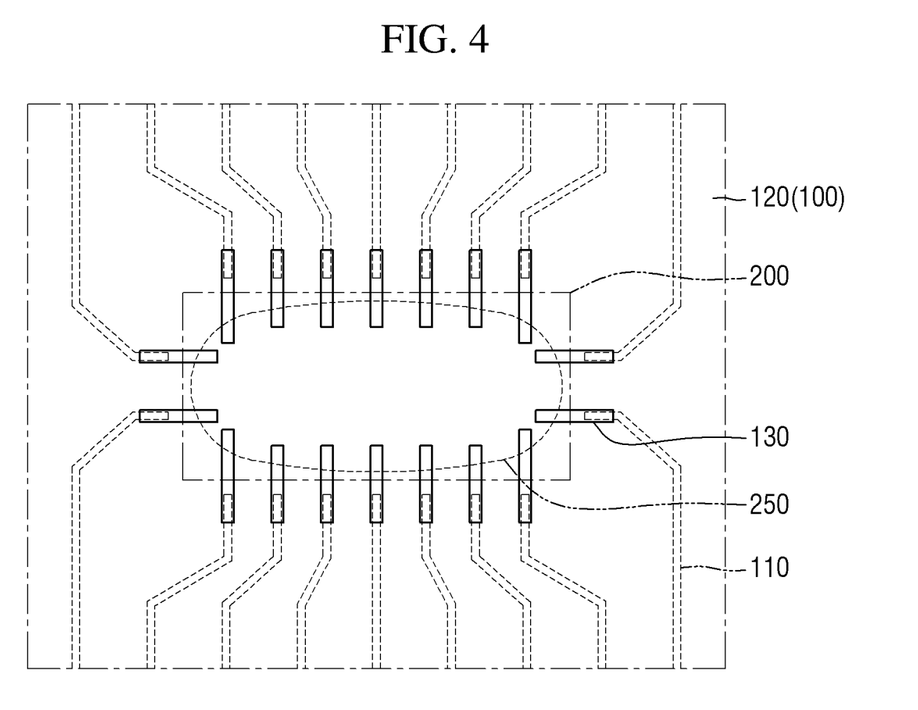
FIG. 4 is a top view of a circuit board according to some exemplary embodiments of the present disclosure.
Figure 5:
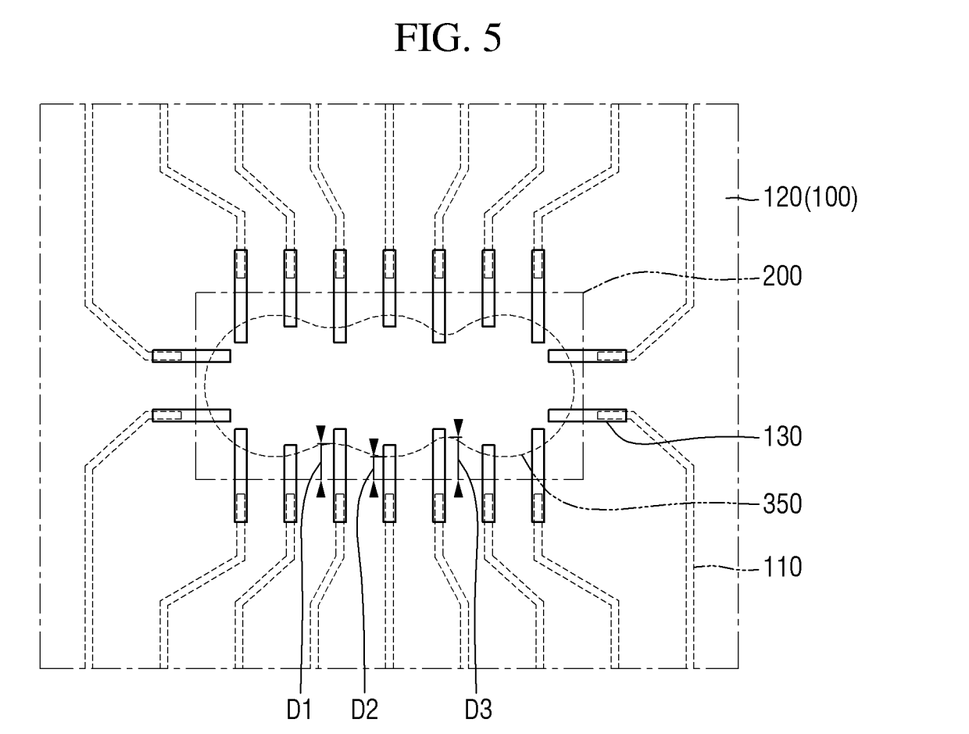
FIG. 5 is a top view of a circuit board according to some exemplary embodiments of the present disclosure.

FIGS. 4 and 5 are top views of circuit boards according to some exemplary embodiments of the present disclosure. Likewise, the redundant description will be omitted and description will be made focusing on the differences.

The dummy patterns shown in FIGS. 4 and 5 are different from the dummy pattern of the flexible circuit board shown in FIG. 1 which has the rectangular shape in that a dummy pattern 250 of FIG. 4 has an elliptical shape and a dummy pattern 350 of FIG. 5 has an amorphous shape depending on the design of the pattern formed on the circuit board.

When the dummy pattern is formed in an elliptical shape, the shape of the outer circumferential surface of the dummy pattern 250 of FIG. 4 may not only have a continuous inclination, but also have a larger area for the patterns 110 and 130 when the first wiring pattern 110 and the lead patterns 130 of an inner lead part or an outer lead part are concentrated at the center of the device 160 due to the pattern design such as a radial shape. Therefore, it is possible to reduce the unevenness due to the patterns 110 and 130 and to improve the efficiency of heat dissipation.

When the dummy pattern 350 is formed in an amorphous shape as shown in FIG. 5, the distances D1, D2 and D3 between the longer side of the device mount area and different positions of the dummy pattern may be different from one another. Accordingly, it is possible to reduce the surface unevenness even if patterns are formed in a staggered manner.

Figure 6:
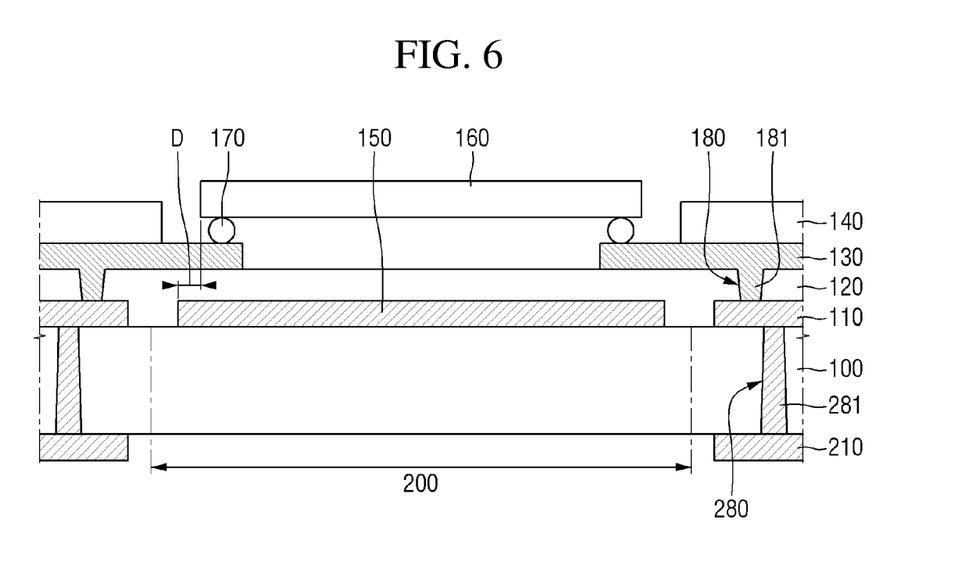
FIG. 6 is a top view of a circuit board according to some exemplary embodiments of the present disclosure.

FIG. 6 is a cross-sectional view of a circuit board in accordance with some exemplary embodiments of the present disclosure, taken along the line A-A' of FIG. 1. Hereinafter, the redundant description will be omitted and description will be made focusing on the differences.

Referring to FIG. 6, a circuit board according to some exemplary embodiments of the present disclosure may further include a second wiring pattern 210 formed on the other surface of the base substrate 100.

The second wiring pattern 210 may be formed on the other surface, which is the opposite surface of one surface of the base substrate 100 on which the first wiring pattern 110 is formed. The second wiring pattern 210 may include the same material as the first wiring pattern 110, and more specifically, may include a material having electrical conductivity such as copper, gold and aluminum.

The first wiring pattern 110 may be electrically connected to the second wiring pattern 210 through a via 281. Specifically, a via hole 280 may be formed through the base substrate 100, and the via hole 280 may be filled with the via 281.

As shown in FIG. 6, the shape of the via 281 may have, but is not limited to, a trapezoidal shape in which the lower surface in contact with the second wiring pattern 210 has a larger width. This shape may be because the via hole 280 is formed from the other surface of the base substrate 100 when the via hole 280 is formed. The via hole 280 in which the upper surface has a larger width than the lower surface and a via 281 filling the via hole 280 may be formed depending on the direction in which the via hole 280 is formed.

In the foregoing description, the circuit board according to some exemplary embodiments of the present disclosure has been described as having the structure in which the wiring pattern 110 made up of a single layer is formed on the surface. Alternatively, the circuit board may have a structure including n wiring layers, where n is a natural number equal to or greater than two. That is to say, the circuit board may further have a structure of two or more layers in which another lead pattern is formed on the second protective layer 140 and a protective layer covering the lead pattern is formed. Alternatively, another circuit board may be bonded to the circuit board having the structure of FIG. 2 or 6 so that a multiple-layer substrate structure may be implemented. When the structure includes n layers, the layers may be electrically connected to one another via conductive via holes, etc.

FIGS. 7 to 10 are cross-sectional views for illustrating processing steps of a method of fabricating a circuit board according to some exemplary embodiments of the present disclosure.

Figure 7:
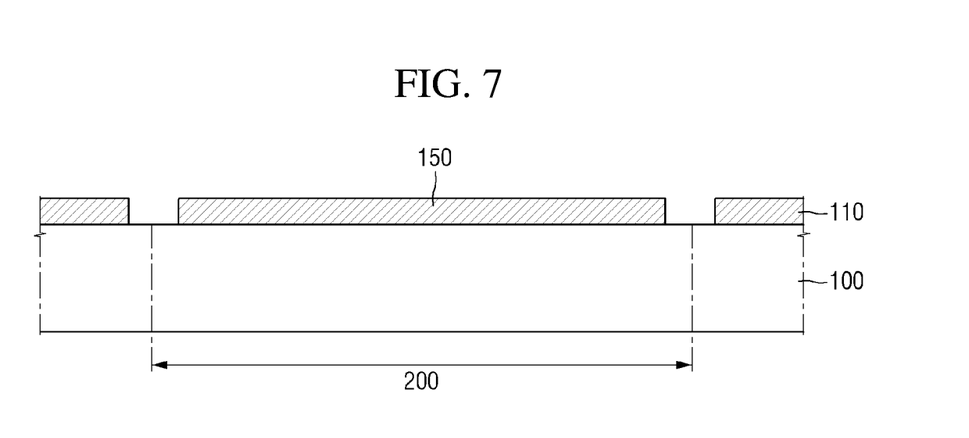
FIGS. 7 to 10 are cross-sectional views for illustrating processing steps of a method of fabricating a circuit board according to some exemplary embodiments of the present disclosure.

Referring to FIG. 7, a first wiring pattern 110 and a dummy pattern 150 are formed on a base substrate 100.

The base substrate 100 may be a flexible circuit board or a rigid circuit board. The first wiring pattern 110 may be formed on the base substrate 100, for example, by forming a thin metal layer on the base substrate 100 to etch and pattern it (photoetching); by forming resist patterns on the base substrate 100 having an underlying layer, electroplating a conductive material between the resist patterns to remove the resist patterns and the underlying layer so that the first wiring pattern 110 is formed (semi-additive process); or printing a conductive paste to form the first wiring pattern 110 (printing).

According to some exemplary embodiments of the present disclosure, the dummy pattern 150 may be formed simultaneously with the first wiring pattern 110. That is to say, when the first wiring pattern 110 is formed, the shape of the dummy pattern 150 in the device mount area 200 may be formed by one of the photoetching, the semi-additive process, and the printing.

Figure 8:
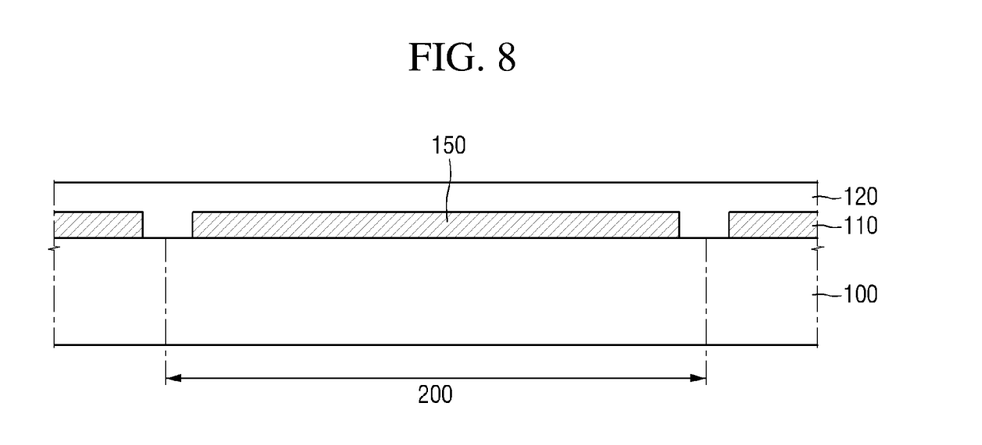

Referring to FIG. 8, a first protective layer 120 is formed to cover the first wiring pattern 110 and the dummy pattern 150.

The first protective layer 120 may be formed by printing or laminating a solder resist or coverlay film on the base substrate 100.

Figure 9:
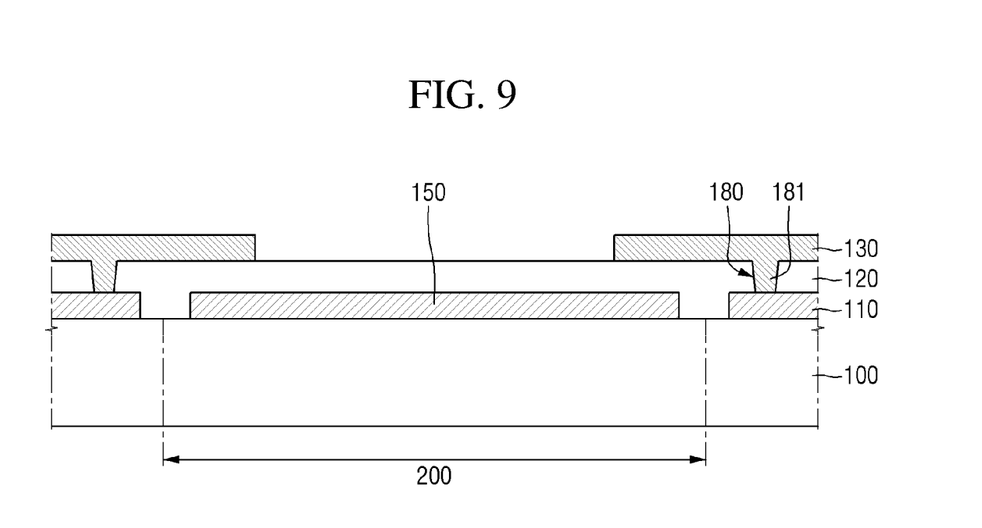

Referring to FIG. 9, a through hole 180 penetrating through the first protective layer 120 is formed, and lead patterns 130 and a connection wiring 181 filling the through hole 180 are formed. The lead patterns 130 may be electrically connected to the first wiring pattern 110 by the connection wiring 181.

For example, the through hole 180 may be formed by forming a mask pattern on the first protective layer 120 and etching the first protective layer 120 using the mask pattern as an etch mask. It is, however, to be understood that the present disclosure is not limited thereto.

The connection wiring 181 and the lead patterns 130 may be formed by forming a seed layer on the inner side wall of the through hole 180 and the upper surface of the first protective layer 120, electrolytically or electrolessly plating it to form copper wire, and plating the surface of the copper wire with tin or the like.

Figure 10:
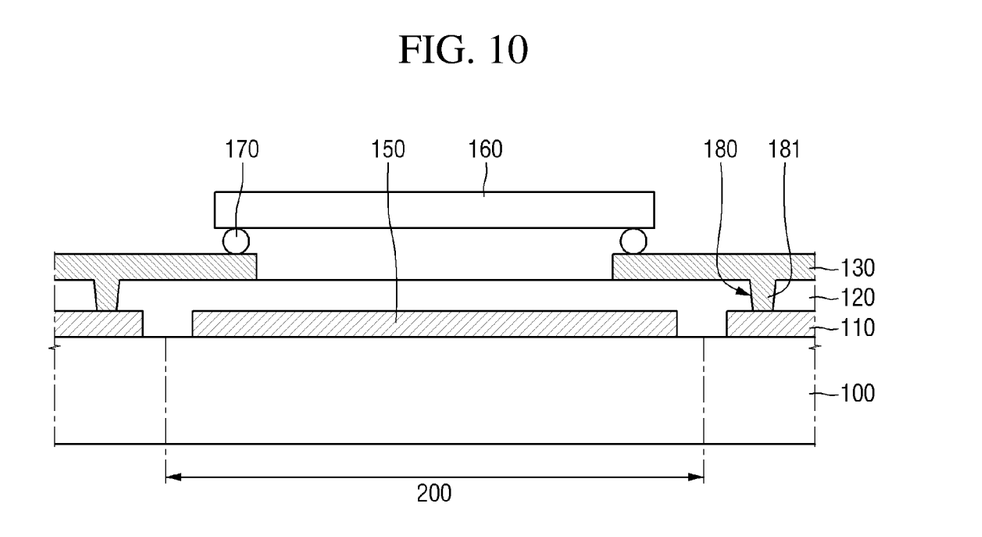

Referring to FIG. 10, a device 160 is mounted on the lead patterns 130. When the device 160 is a passive element, the device 160 may be bonded to the lead patterns 130 by solder. When the device 160 is a semiconductor device, a bump of the device 160 may be disposed on the lead pattern 130 and bonded to it via a reflow process.

Subsequently, referring back to FIG. 2, a second protective layer 140 is formed to cover the lead pattern 130. The second protective layer 140 may expose the lead pattern 130 on the device mount area 200.

The second protective layer 140 may be formed by printing or laminating a solder resist or coverlay film.

In addition, a process for fabricating the circuit board of FIG. 6 may be additionally carried out.

Specifically, the method of fabricating the circuit board according to an exemplary embodiment of the present disclosure may further include forming a via hole 280 through the base substrate 100, and forming a via 281 and a second wiring pattern 210. The forming the via 281 and the second wiring pattern 210 may include, for example, forming a seed layer inside the via hole 280 and on the other surface of the substrate 100, and electrolytically or electrolessly plating it.

According to some exemplary embodiments of the present disclosure, the via 281 and the second wiring pattern 210 may be formed simultaneously. It is, however, to be understood that the present disclosure is not limited thereto. The via 281 may be formed first by filling the via hole 280 with a conductive material, and then the second wiring 210 may be formed.

In addition to the above process, a process for fabricating a circuit board including an n wiring layers may be additionally performed, where n is a natural number equal to or greater than two. For example, a process for forming another lead pattern on the second protective layer 140 and a protective layer covering the lead pattern may be further performed.

Alternatively, a process of bonding another circuit board to the circuit board formed according to the method described above with reference to FIGS. 7 to 10 may be further performed. In other words, the n-layer circuit board may be fabricated by bonding another circuit board electrically connected to the wiring pattern 110 or the lead patterns 130.

In fabricating the n-layer circuit board, a process of forming conductive via holes or the like so that the layers are electrically connected to one another may be further added.

Although the exemplary embodiments of the present disclosure have been described with reference to the accompanying drawings, those skilled in the art will readily appreciated that various modifications and alterations may be made without departing from the technical idea or essential features of the present disclosure. Therefore, it should be understood that the above-mentioned embodiments are not limiting but illustrative in all aspects.

| [Brief Description of Numerical References] | |
| --- | --- |
| 100: circuit board | 110, 210: wiring pattern |
| 120, 140: protective layer | 130: lead pattern |
| 150: dummy pattern | 160; device |
| 170: connector | |

What is claimed is:

1. A circuit board comprising:
    a base substrate having a device mount area defined thereon;
    a first wiring pattern formed on a first surface of the base substrate;
    a dummy pattern formed on the base substrate, wherein at least a part of the device mount area is filled with the dummy pattern;
    a first protective layer covering the first wiring pattern and the dummy pattern; and
    a lead pattern formed on the first protective layer, wherein the lead pattern is extended to the device mount area,
    wherein the dummy pattern comprises:
    a hole via which the base substrate in the device mount area is exposed; and
    a periphery around the hole, and
    wherein the lead pattern is not formed on the hole,
    wherein the lead pattern comprises a bonding portion where a device is mounted in the device mount area,
    wherein the dummy pattern is expanded outwardly of the bonding portion by a first distance, and
    wherein the dummy pattern is formed at a same level as the first wiring pattern and is not connected to a pattern of other layer.

2. The circuit board of claim 1, wherein the first distance ranges from 0.1 pm to 100 pm.

3. The circuit board of claim 1, further comprising:
    a through hole formed through the first protective layer, wherein the first wiring pattern is exposed via the through hole; and
    a connection wiring electrically connecting the lead pattern with the first wiring pattern, wherein the through hole is filled with the connection wiring.

4. The circuit board of claim 1, further comprising:
    a second protective layer formed to cover the lead pattern above the first protective layer.

5. The circuit board of claim 1, wherein the dummy pattern is not connected to the first wiring pattern.

6. The circuit board of claim 1, further comprising:
    a second wiring pattern formed on a second surface of the base substrate; and a via penetrating through the base substrate to electrically connect the first wiring pattern with the second wiring pattern.

7. The circuit board of claim 1, wherein the circuit board is implemented as a stack of n layers, wherein n is a natural number equal to or greater than two.

8. A method of fabricating a circuit board, the method comprising:
providing a base substrate having a device mount area defined thereon;
forming a wiring pattern and a dummy pattern on a first surface of the base substrate, wherein the dummy pattern is formed in the device mount area;
forming a first protective layer to cover the wiring pattern and the dummy pattern; and
forming a lead pattern extended from the device mount area on the first protective layer,
wherein the dummy pattern comprises:
a hole via which the base substrate in the device mount area is exposed; and
a periphery around the hole, and
wherein the lead pattern is not formed on the hole,
wherein the lead pattern comprises a bonding portion where a device is mounted in the device mount area,
wherein the dummy pattern is expanded outwardly of the bonding portion by a first distance, and
wherein the dummy pattern is formed at a same level as the first wiring pattern and is not connected to a pattern of other layer.

9. The method of claim 8, wherein the forming the lead pattern comprises
forming a through hole through the first protective layer to expose the wiring pattern;
forming a connection wiring so that the through hole is filled with the connection wiring; and
plating a surface of the connection wiring.

10. The method of claim 9, comprising: simultaneously forming the connection wiring and the lead pattern.

11. The method of claim 10, further comprising: forming a second protective layer to cover the lead pattern above the first protective layer.

12. The method of claim 8, further comprising:
forming a via hole penetrating the base substrate;
forming a via so that the via hole is filled with the via; and
forming a second wiring pattern electrically connected to the first wiring pattern through the via.

13. The method of claim 8, further comprising:
forming an additional lead pattern on a second protective layer, and an additional protective layer covering the additional lead pattern, to form the circuit board made up of n layers on the second protective layer, which is formed on the first protective layer to cover the lead pattern, wherein n is a natural number equal to or greater than two.

14. The method of claim 8, further comprising:
bonding another circuit board connected to the wiring pattern or the lead pattern to form the circuit board made up of n layers.

* * * * *